US006266270B1

(12) United States Patent
Nobukata

(10) Patent No.: US 6,266,270 B1
(45) Date of Patent: Jul. 24, 2001

(54) NON-VOLATILE SEMICONDUCTOR MEMORY AND PROGRAMMING METHOD OF THE SAME

(75) Inventor: Hiromi Nobukata, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/358,589

(22) Filed: Jul. 21, 1999

(30) Foreign Application Priority Data

Jul. 23, 1998 (JP) ................................................ 10-208268

(51) Int. Cl.[7] ................................................ G11C 16/04

(52) U.S. Cl. ................................ 365/185.03; 365/185.19; 365/185.12

(58) Field of Search ......................... 365/185.03, 185.19, 365/185.12

(56) References Cited

U.S. PATENT DOCUMENTS 4,817,057 * 3/1989 Kondo et al. ........................ 365/203
5,847,992 * 12/1998 Tanaka et al. .................. 365/185.03
5,910,918 * 6/1999 Hirano ............................ 365/185.16
5,943,260 * 8/1999 Hirakawa ........................ 365/185.03
6,023,781 * 2/2000 Hazama ............................... 714/773
6,064,611 * 5/2000 Tanaka et al. ....................... 365/203

OTHER PUBLICATIONS

1995 IEEE International Solid–State Circuits Conference; Digest of Technical Papers; A Multilevel–Cell 32Mb Flash Memory; M. Bauer et al. (pp. 132, 133 and 135).

1996 IEEE International Solid–State Circuits Conference; Digest of Technical Papers; A 3.3V 128Mb Multi–level NAND Flash Memory for Mass Storage Applications; Tae-Sung Jung et al. (pp. 32 and 33).

* cited by examiner

*Primary Examiner*—Vu A. Le
*Assistant Examiner*—VanThu Nguyen
(74) *Attorney, Agent, or Firm*—Ronald P. Kananen; Rader, Fishman & Grauer

(57) ABSTRACT

A non-volatile semiconductor memory capable of dealing with eight levels and a method of writing data therein, which can shorten the writing time and perform verify read and normal read operations at a high speed by connecting a bit line to a supply source of a voltage in accordance with latch data of a latch circuit after charging all bit lines at a power source voltage level before a write operation, and by performing the write operations in parallel.

11 Claims, 10 Drawing Sheets

11 A0 A1 BL0 BL1 SG1A SG1B SSL WL0 WL1 WL2 MT0A MT1A MT2A MT0B MT1B MT2B MT13A MT13B WL13 WL14 WL15 MT14A MT15A MT14B MT15B SG2A SG2B GSL VGL Vcc TRN NT21 NT22 NT23 NT24 Ai Vref PT21 SA21 20 PGM NT26 SA22 21 DIS NT25 GND NT27 NT29 NT31 NT33 NT34 NT32 NT30 NT35 N23b VB1 VB2 VB3 N21b N23a N22a Q23 Q22 Q21 N21a N22b NT28 NT36 NT37 NT38 RST NT43 NT39 NT40 NT41 22 NT42 ΦLAT0 NT46 NT51 NT56 NT61 ΦLAT1 NT44 NT47 NT49 NT52 NT57 NT59 NT62 NT64 NT65 ΦLAT2 NT45 NT48 NT50 NT58 NT54 NT53 NT55 NT60 NT63 ΦLAT3 ΦLAT4 ΦLAT5 ΦLAT6 ΦLAT7 ΦLAT8 ΦLAT9 Y0_0 Y0_1 Y0_2 Y0_3 NT66 NT67 NT68 I00 I01 I02 10

11
A0
A1
BL0
BL1
SSL
WL0
WL1
WL2
WL13
WL14
WL15
GSL
VGL
SG1A
SG1B
MT0A
MT0B
MT1A
MT1B
MT2A
MT2B
MT13A
MT13B
MT14A
MT14B
MT15A
MT15B
SG2A
SG2B
TRN
NT21
NT22
Ai
NT23
NT24
Vcc
Vref
PT21
SA21
20
PGM
NT26
SA22
DIS
NT25
GND
21
NT27
NT29
NT31
NT33
NT34
NT32
NT30
NT35
N23b
VB1
VB2
VB3
N21b
N23a
N22a
Q21
Q23
Q22
N22b
N21a
NT28
NT37
NT36
NT38
RST
NT43
NT39
NT40
NT41
22
NT42
φLAT0
NT46
NT51
NT56
NT61
NT44
φLAT1
NT47
NT49
NT52
NT57
NT59
NT62
NT64
NT65
NT45
NT58
φLAT2
NT48
NT50
NT54
NT53
NT55
NT60
NT63
φLAT3
φLAT4
φLAT5
φLAT6
φLAT7
φLAT8
φLAT9
NT66
NT67
NT68
Y0_0
Y0_1
Y0_2
Y0_3
I00
I01
I02
10

IDEAL BIT LINE VOLTAGE AT WRITING IN PARALLEL
REALISTIC BIT LINE VOLTAGE AT WRITING IN PARALLEL
EXAMPLE OF APPLIED BIT LINE VOLTAGE AT WRITING IN PARALLEL
Vth
3.6
3.0
2.4
1.8
1.2
0.6
0.0
Distribution
DISTRIBUTION 7:0.0V
DISTRIBUTION 6:0.6V
GND
0.0V
DISTRIBUTION 5:1.2V
DISTRIBUTION 4:1.8V
VB1
1.2V
DISTRIBUTION 3:2.4V
DISTRIBUTION 2:3.0V
VB2
1.5V
DISTRIBUTION 1:3.6V
VB3
1.5V
DISTRIBUTION 0:8.0V
Vcc
Vcc

NON-VOLATILE SEMICONDUCTOR MEMORY AND PROGRAMMING METHOD OF THE SAME

BACKGROUND OF THE INVENTION

1. Field of the Invention

The present invention relates to a multilevel non-volatile semiconductor memory for recording data of at least three levels to a memory cell and a method of writing the data.

2. Description of the Related Art

In non-volatile semiconductor memory apparatuses such as flash memories, a two-level memory cell structure is normally adopted, which records data having two values, "0" and "1", in one memory cell transistor.

Along with the recent demands for larger capacities of semiconductor memories, a so-called multilevel non-volatile semiconductor memory which records data of at least 3 levels in one memory cell has been proposed (for example, refer to "A Multi-Level 32 Mb Flash Memory" 1995 ISSCC, from p. 132).

FIG. 1 is a view of the relationship of a level of a threshold voltage Vth and data contents when recording data composed of 2 bits having four values in one transistor in a NAND flash memory.

In FIG. 1, the ordinate indicates the threshold voltage Vth and the abscissa indicates a distribution frequency of a memory transistor.

The two-bit data comprising the data to be recorded in one transistor is indicated by ($IO_{n+1}$, $IO_n$). There are four states ($IO_{n+1}$, $IO_n$)=(1, 1), (1, 0), (0, 1), and (0, 0). Namely, there are four states of the data "0", data "1", data "2", and data "3".

Also, a NAND flash memory has been proposed which performs a write operation of multi-level data in page units (word line units) (for example, refer to 1996 IEEE International Solid-State Circuits Conference, ISSCC96/SESSION 2/FLASH MEMORY/PAPER TP 2.1:A 3.3V 128 Mb Multi-Level NAND Flash Memory For Mass Storage Application, pp. 32 to 33).

FIG. 2 is a circuit diagram of the configuration of the core part of a NAND flash memory for performing a write operation in page units disclosed in the above reference.

In FIG. 2, reference number 1 indicates a memory cell array, 2 a write/read control circuit, and BL1 and BL2 bit lines.

The memory cell array 1 comprises memory strings A0 and A1 comprising memory cells respectively connected to common word lines WL0 to WL15. The memory string A0 is connected to the bit line BL1 and the memory string A1 is connected to the bit line BL2.

The memory string A0 has a NAND string comprised of serially connected memory cell transistors MT0A to MT15A comprising non-volatile semiconductor memories having floating gates. A drain of the memory cell transistor MT0A of the NAND string is connected to the bit line BL1 via a select gate SG1A, while a source of the memory transistor MT15A is connected to the reference potential line VGL via a select gate SG2A.

The memory string A1 has a NAND string comprised of serially connected memory cell transistors MT0B to MT15B comprising non-volatile semiconductor memories having floating gates. A drain of the memory cell transistor MT0B of the NAND string is connected to the bit line BL2 via a select gate SG1B, while a source of the memory transistor MT15B is connected to the reference potential line VGL via a select gate SG2B.

Gates of the select gates SG1A and SG1B are commonly connected to a select signal supply line SSL, while gates of the select gates SG2A and SG2B are commonly connected to a select signal supply line GSL.

The write/read control circuit 2 comprises n-channel MOS (NMOS) transistors NT1 to NT17, a p-channel MOS (PMOS) transistor PT1, and latch circuits Q1 and Q2 combining inputs and outputs of an inverter.

The NMOS transistor NT1 is connected between a supply line of a power source voltage Vcc and the bit line BL1 and the gate is connected to a supply line of an inhibit signal IHB1. The NMOS transistor NT2 is connected between the supply line of the power source voltage Vcc and the bit line BL2 and the gate is connected to a supply line of an inhibit signal IHB2.

A depletion NMOS transistor NT18 is connected between a connecting point of an NMOS transistor NT3 and an NMOS transistor NT1 and a connecting point of the memory string A0 and the bit line BL1. A depletion NMOS transistor NT19 is connected between a connecting point of an NMOS transistor NT4 and an NMOS transistor NT2 and a connecting point of the memory string A1 and the bit line BL2. Gates of the NMOS transistors NT18 and NT19 are connected to a decouple signal supply line DCPL.

NMOS transistors NT3, NT5, and NT16 are connected in series between a connecting point of the depletion NMOS transistor NT18 and the NMOS transistor NT1 and a bus line IOi, while NMOS transistors NT4, NT7, and NT17 are connected in series between a connecting point of the depletion NMOS transistor NT19 and the NMOS transistor NT2 and a bus line $IO_{i+1}$.

Also, a connecting point of the NMOS transistors NT3 and NT5 and a connecting point of the NMOS transistors NT4 and NT7 are grounded via an NMOS transistor NT6 and connected to a drain of the PMOS transistor PT1 and gates of NMOS transistors NT8 and NT13. A gate of the NMOS transistor NT6 is connected to a supply line of a reset signal RST, a source of the PMOS transistor PT1 is connected to a supply line of the power source voltage Vcc, and a gate of the PMOS transistor PT1 is connected to a supply line of a signal Vref.

A first memory node N1$a$ of the latch circuit Q1 is connected to a connecting point of NMOS transistors NT5 and NT16, while a second memory node N1$b$ is grounded via NMOS transistors NT8 to NT10 connected in series.

A first memory node N2$a$ of the latch circuit Q2 is connected to a connecting point of the NMOS transistors NT7 and NT17, while a second memory node N2$b$ is grounded via NMOS transistors NT13 to NT15.

A connecting point of the NMOS transistors NT8 and NT9 is grounded via the NMOS transistors NT11 and NT12 connected in series.

A gate of the NMOS transistor NT9 is connected to a first memory node N2$a$ of the latch circuit Q2, a gate of the NMOS transistor NT10 is connected to a supply line of a control signal (ϕLAT2, a gate of the NMOS transistor NT11 is connected to a second memory node N2$b$, a gate of the NMOS transistor NT12 is connected to a supply line of a control signal ϕLAT1, and gates of the NMOS transistors NT14 and NT15 are connected to a supply line of a latch control ϕLAT3.

A gate of the NMOS transistor NT16 serving as a column gate is connected to a supply line of a signal Yi and a gate of the NMOS transistor NT17 is connected to a supply line of a signal Yi+1.

FIG. 3A is a timing chart at the time of reading and FIG. 3B is a timing chart at the time of writing (programming).

As will be understood from FIG. 3B, writing of four values is carried out in three steps. The procedure moves on to the next step at the stage when it is judged that all cells to which the write operation was originally to be performed in page units in each of the steps are sufficiently written in.

A read operation will be explained next.

First, a reset signal RST and signals PGM1 and PGM2 are set at a high level. Due to this, the first memory nodes N1*a* and N2*a* of latch circuits Q1 and Q2 are drawn to the ground level. As a result, the latch circuits Q1 and Q2 are cleared.

Next, a word line voltage is made to be 2.4V and a read operation is performed. The bit line voltage is held at a precharge voltage due to the fact that a cell current does not flow when the threshold voltage Vth is higher than the word line voltage (2.4V), and a high level is sensed. Conversely, when the threshold voltage Vth is lower than the word line voltage (2.4V), a cell current flows, so that the bit line voltage falls and a low level is sensed.

Next, a read operation is carried out when the word line voltage is at 1.2V, then, finally, at 0V.

Specifically, since a current does not flow in any word lines when the cell data is "00", (1, 1) is output to buses $IO_{i+1}$ and $IO_i$. First, when the word line voltage is made 2.4V for a read operation, the control signal ϕLAT1 is set at a high level. At this time, the bit line is held at a high level due to the fact a cell current does not flow. Therefore, the NMOS transistor NT8 is kept in a conductive state. Due to the fact that the latch circuit Q2 is cleared, the second memory node N2*b* of the latch circuit Q2 is held at a high level. Therefore, the NMOS transistor NT11 is kept conductive. Accordingly, the NMOS transistors NT8, NT11, and NT12 are kept conductive, the second memory node N1*b* of the latch circuit Q1 is drawn to the ground level, and the first memory node N1*a* of the latch circuit Q1 shifts to a high level. Next, when making the word line voltage 1.2V for a read operation, the control signal ϕLAT3 is set to a high level. At this time, due to the fact that the cell current does not flow, the bit line is held at a high level. Therefore the NMOS transistor NT13 is kept conductive, the second memory node N2*b* of the latch circuit Q2 is drawn to the ground level, the second memory node N2*b* of the latch circuit Q2 is drawn to the ground level, and the first node N2*a* of the latch circuit Q2 shifts to a high level. Finally, when making the word line voltage 0V for a read operation, the control signal ϕLAT1 is set to be a high level. At this time, due to the fact that the cell current does not flow, the bit line is kept at a high level. Therefore, the NMOS transistor NT8 is kept conductive, however, since the second memory node N2*b* of the latch circuit Q2 is at a low level, the NMOS transistor NT11 becomes non-conductive and the first memory node N1*a* of the latch circuit Q1 is held at a high level.

When the cell data is "01", the current flows only when the word line voltage is VWL00 and (1, 0) is output to the buses IOi+1 and IOi. First, when reading with the word line voltage 2.4V, the control signal ϕLAT1 is set to a high level. At this time, due to the fact that the cell current flows, the bit line becomes a low level. Therefore, the NMOS transistor NT8 is kept nonconductive and the first memory node N1*a* of the latch circuit Q1 is held at a low level. Next, when reading with the word line voltage 1.2V, the control signal ϕLAT3 is set to a high level. At this time, due to the fact that the cell current does not flow, the bit line is held at a high level. Therefore, the NMOS transistor NT13 is kept conductive, the second memory node N2*b* of the latch circuit Q2 is drawn to the ground level, and the first memory node N2*a* of the latch circuit Q2 shifts to a high level. Finally, when reading with the word line voltage 0V, the control signal ϕLAT1 is set to a high level. At this time, due to the fact that the cell current does not flow, the bit line is held at a high level. Therefore, the NMOS transistor NT8 is kept conductive, however, since the second memory node N2*b* of the latch circuit Q2 is at a low level, the NMOS transistor NT11 becomes nonconductive and the first memory node N1*a* of the latch circuit Q1 is held at a low level.

In the case where the cell data is "10" or "11", (0, 1) and (0, 0) are read respectively to $IO_{i+1}$ and $IO_i$ in the same way.

Next, a write operation will be explained.

In the circuit of FIG. 2, a write operation is performed first by data stored in the latch circuit Q1, then by data stored in the latch circuit Q2, finally by data stored in the latch circuit Q1 again.

Here, in the case where the write data is (Q2, Q1)=(1, 0), the latch circuit Q1 inverts "0" to "1" when sufficiently written. In the case where (Q2, Q1)=(0, 0), the latch circuit Q1 does not invert "0" to "1" even when sufficiently written in the first step because it is necessary to use the data also as write data in the third step.

Regarding the judgement whether the write operation is completed in each of the steps, it is judged that the write operation is completed in the step at the stage when all of the latch data (Q2 or Q1) on the noted side is "1".

The judgement of completion by a wired-OR is not carried out to cells of write data (Q2, Q1)=(0, 0) because the latch circuit Q1 does not invert in the first step.

In the above circuit, as shown in FIG. 4, a write operation is performed on the cells having the write data "10" and "00" in accordance with the data of the latch circuit Q1 (Step 1), then, a write operation is performed on the cells having the write data "01" and "00" in accordance with the data of the latch circuit Q2 (Step 2), and finally, a write operation is performed on the cells having the write data "00" (Step 3).

Namely, in the above circuit, the write operation of the write data "10" and "01" is performed only at Step 1 and at Step 2, so that the write times of "10" and "01" as they are correspond to those of Step 1 and Step 2. The write operation is performed in all steps from Step 1 to Step 3 on the cells having the write data "00", however, between Step 2 and Step 3, the write operation in Step 3 is performed after the ISPP voltage is reduced in preparation for excessive writing.

It is assumed from the above that the write time of a cell having the write data "00" is almost the same as the write time in Step 3. As a result, the write operation is performed serially. This is a cause for the write time of four-level data becoming long.

As will be understood from FIG. 4, the sum of the write time of data "10" and "01" is almost the same as the write time of data "00".

Also, the write operation is carried out by using a self-boost; however, a write inhibit voltage charged on the bit lines drops by the threshold voltage Vth to Vcc-Vth (B) (where Vth(B) is the threshold voltage Vth affected by back bias) due to the NMOS transistor to which signals PGM1 and PGM2 are supplied.

To enable self-boosting under this condition, it is necessary that the select gate on the drain side of the memory cell be set to be high, which becomes an obstacle for the realization of a high speed read operation.

Furthermore, the bit line is charged before the write operation in the latch; however, the bit line is a huge capacitor having the voltage 0V when looking from the latch. Thus, when the latch data is "1", there is a possibility that the latch data will invert at the moment of contact with the bit line.

To avoid the above, the gate voltage of the NMOS transistors NT5 and NT7 go down roughly 2V when charging the bit line in accordance with the write data. Therefore, the charging current becomes small and the bit line takes a long time to charge.

It also takes time for a verify read operation.

The above disadvantages become further serious in the case where the level of the multi-level data is still higher, for example, as shown in FIG. 5 in the case of eight-level data in which the distribution of the threshold voltage is divided into eight, from a distribution 0 to distribution 7.

In order to meet recent demands for higher integration, it can be considered to further increase the levels of multi-level data. Therefore, it is necessary to realize high speed write and verify operations even in the case of eight-level data etc.

SUMMARY OF THE INVENTION

An object of the present invention is to provide a non-volatile semiconductor memory which can shorten the writing and verify reading time and a data programming method of the same.

To attain the above object, according to a first aspect of the present invention, there is provided a nonvolatile semiconductor memory having a memory cell for storing data of a value in accordance with a threshold voltage which changes in accordance with a change of a charge stored in a charge storage portion in accordance with a voltage applied to a word line and a bit line and writing three-bit eight-level data to memory cells in page units, comprising a precharge means for precharging all bit lines at a predetermined voltage prior to a write operation and a write control circuit for performing a write operation in parallel, including a latch circuit for latching write data, wherein a bit line selected in accordance with an address is set at a voltage in accordance with latch data.

According to a second aspect of the present invention, there is provided a non-volatile semiconductor memory comprising, in a matrix array, memory strings each of which is comprised of a plurality of memory cells storing data of values in accordance with a threshold voltage which changes in accordance with a change of charges stored in charge storage portions in accordance with a voltage applied to a word line and a bit line and each of which has one end and another end connected to a bit line and a ground line via a selection transistor controlled in conductive state in accordance with a gate voltage, control gates of the memory cells of the same row being connected to a common word line, and writing three-bit eight-level data to memory cells in page units using self boost, comprising a precharge means for precharging all bit lines at a predetermined voltage prior to a write operation and a write control circuit for performing a write operation in parallel, including a latch circuit for latching write data, wherein a bit line selected in accordance with an address is set at a voltage in accordance with latch data.

Preferably, the write control circuit is provided with three bits worth of the above latch circuits corresponding to the pairs of bit lines.

More preferably, the latch circuit comprises a first memory node for holding a level of latch data and a second memory node for holding an inverted level to the level and a means for connecting the selected bit line to a power supply source of a bit line set voltage when levels of the first memory node and the second memory node of the latch circuit are at a predetermined level.

Preferably, provision is made of a verify read circuit wherein a judgement whether or not respective writing bits are sufficiently written during the write operation is performed by lowering a word line voltage from a higher level to a lower level successively.

According to a third aspect of the present invention, there is provided a method of writing data in a non-volatile semiconductor memory having a memory cell for storing data of a value in accordance with a threshold voltage which changes in accordance with a change of a charge stored in a charge storage portion in accordance with a voltage applied to a word line and a bit line and writing three-bit eight-level data to memory cells in page units, comprising precharging all bit lines at a predetermined voltage prior to a write operation and performing a write operation in parallel by setting a selected bit line in accordance with an address to a voltage in accordance with latch data when writing.

According to a non-volatile semiconductor memory of the present invention for writing three-bit eight-level data to memory cells in page units, all of the bit lines are precharged to be a predetermined voltage, for example, at a power source voltage prior to a write operation, then, a selected bit line in accordance with an address is set at a voltage in accordance with latch data and the write operation is performed in parallel.

BRIEF DESCRIPTION OF THE DRAWINGS

These and other objects and features of the present invention will become clearer from the following description of the preferred embodiments given with reference to t accompanying drawings, in which:

FIG. 3, having

FIG. 7, having

DESCRIPTION OF THE PREFERRED EMBODIMENTS

Below, preferred embodiments will be described with reference to the accompanying drawings.

Figure 1:
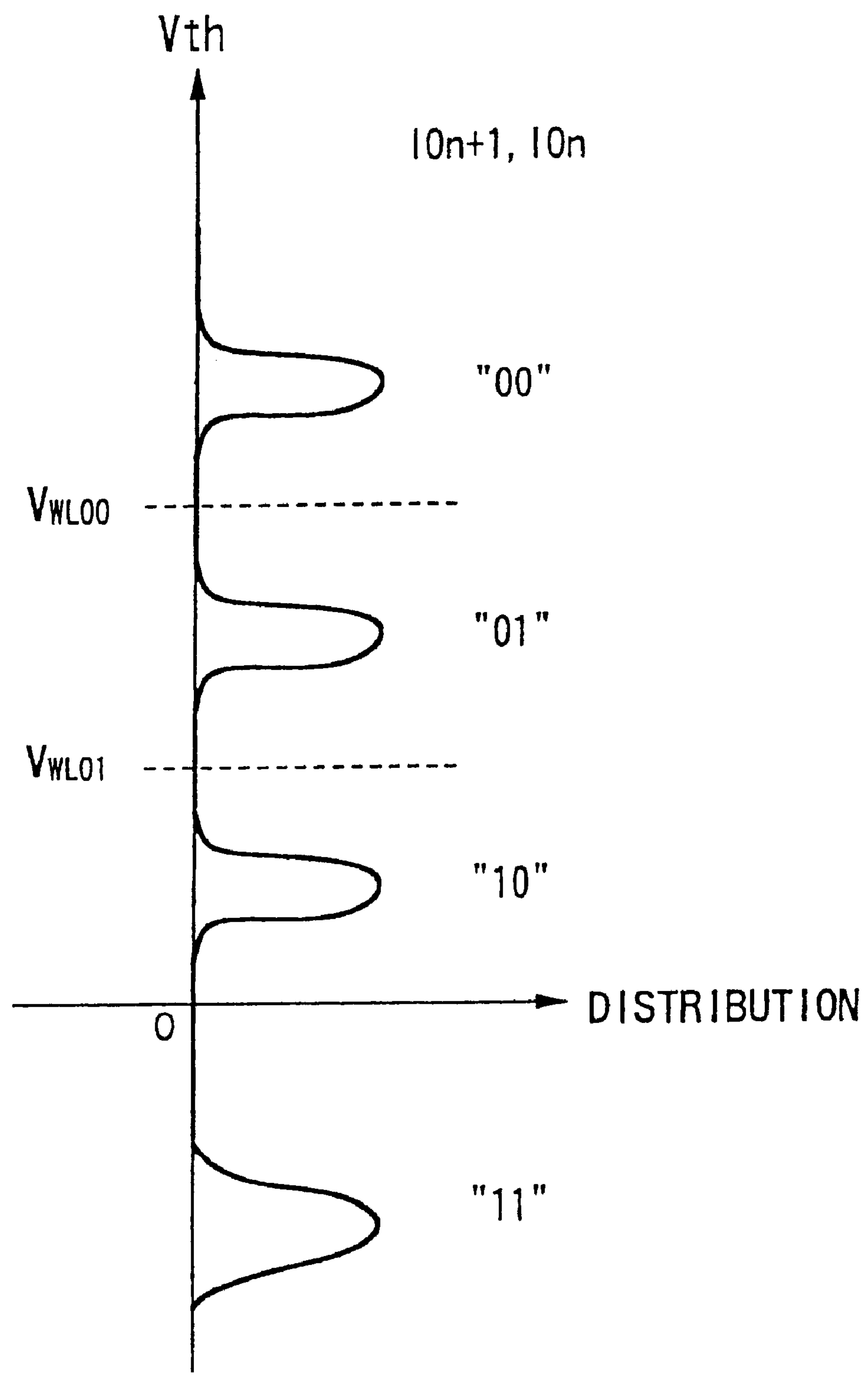
FIG. 1 is a view of the relationship of a level of a threshold voltage Vth and data contents in the case of recording two-bit four-level data in one memory transistor in a NAND flash memory.
Figure 2:
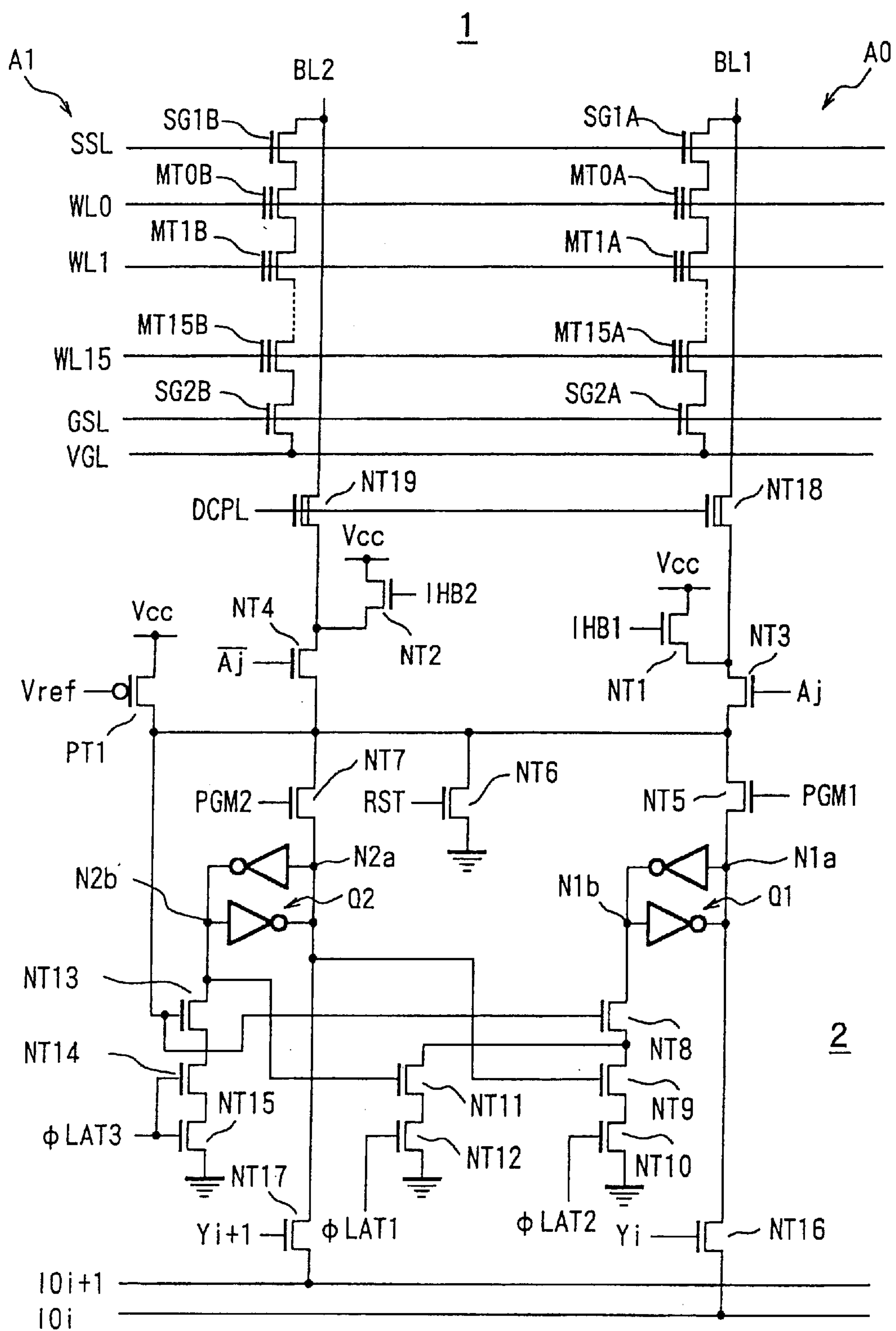
FIG. 2 is a circuit diagram of the core structure of a four-level NAND flash memory of the related art.
Figure 3A:
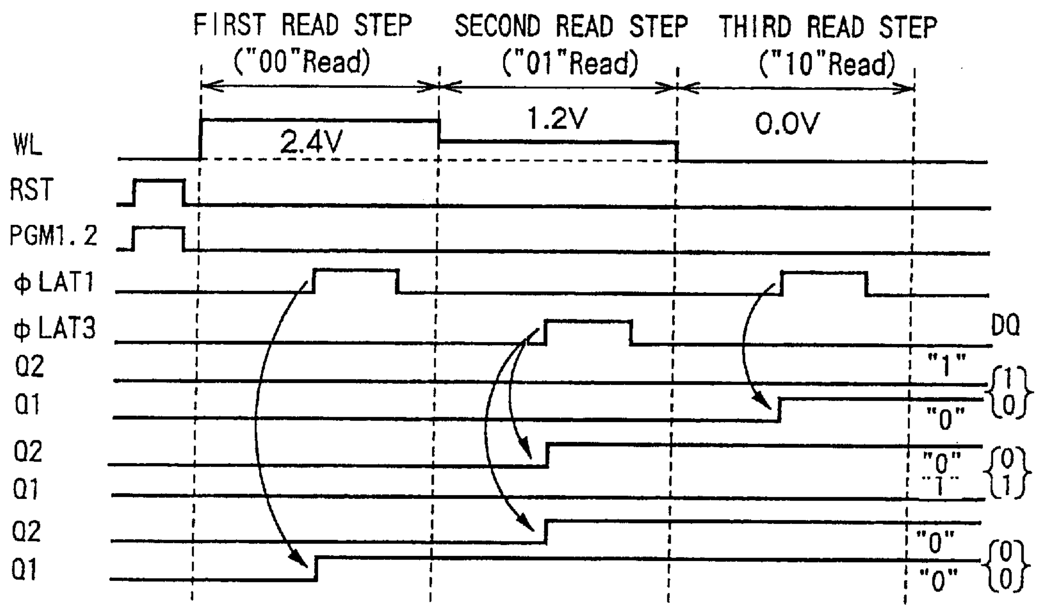
FIGS. 3A and 3B, is a timing chart for explaining an operation of he circuit of FIG. 2.
Figure 3B:
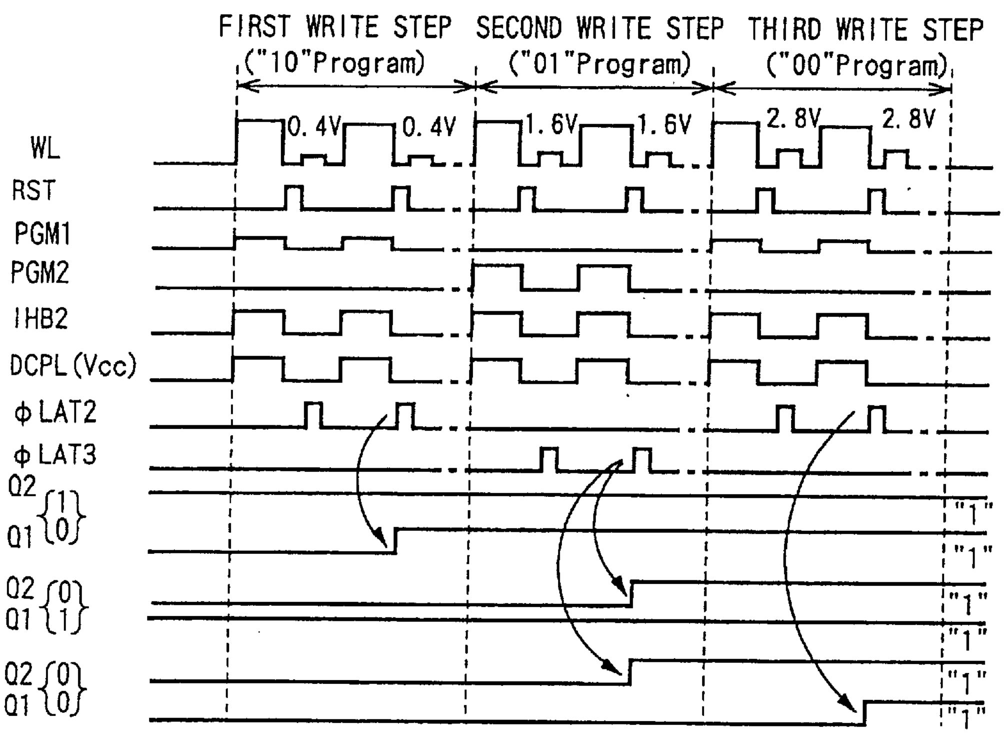
Figure 4:
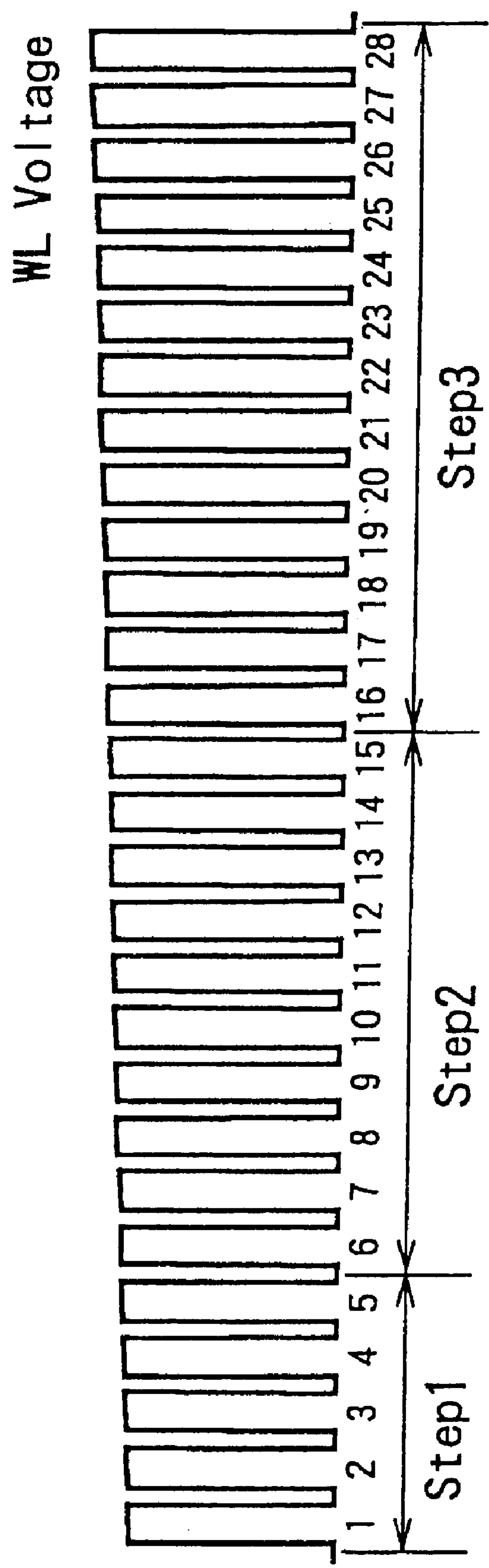
FIG. 4 is a view for explaining disadvantages of the related art.
Figure 5:
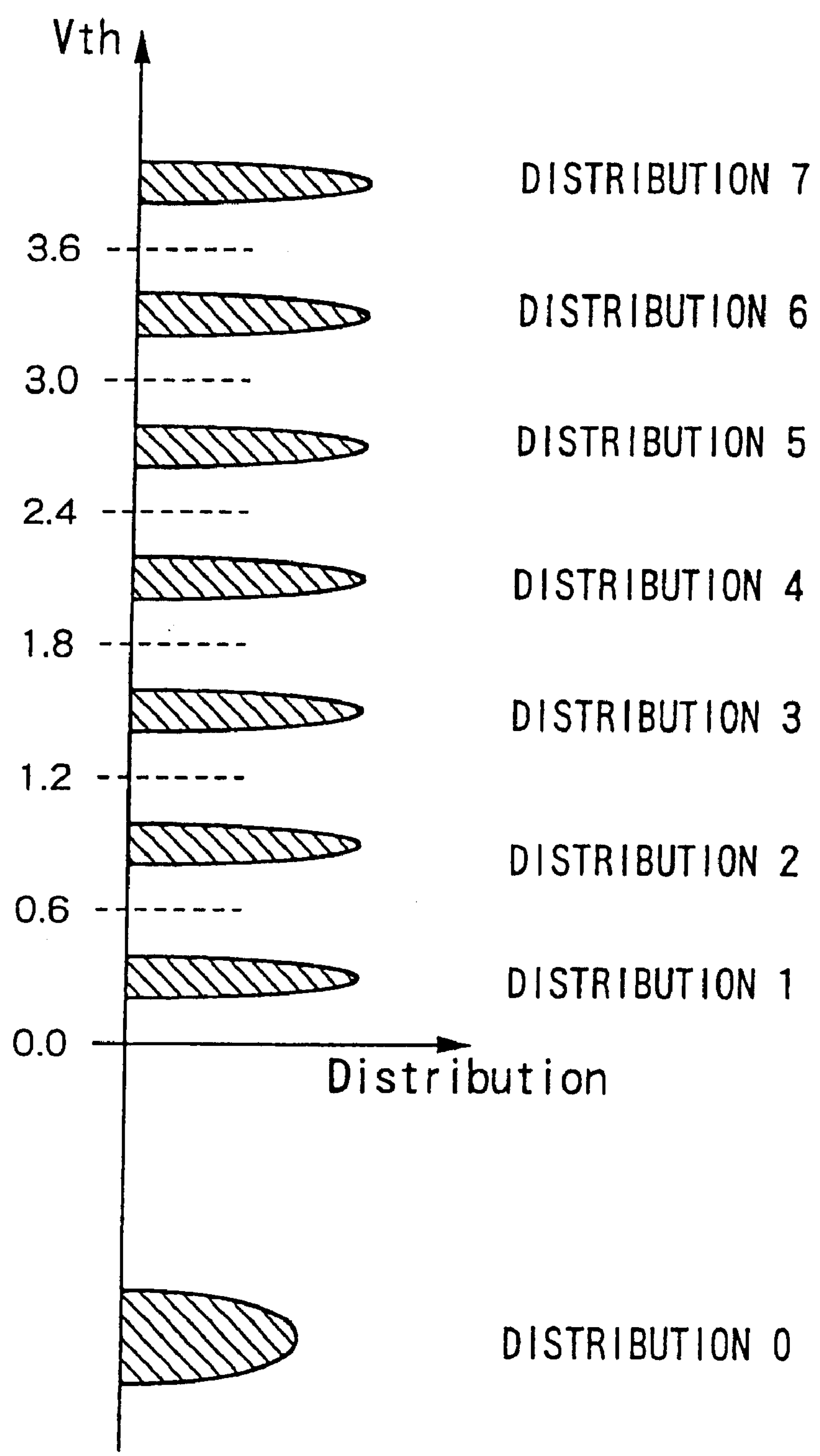
FIG. 5 is a view of the relationship of a level of a threshold voltage Vth and data contents in the case of recording three-bit eight-level data in one memory transistor in a NAND flash memory.
Figure 6:
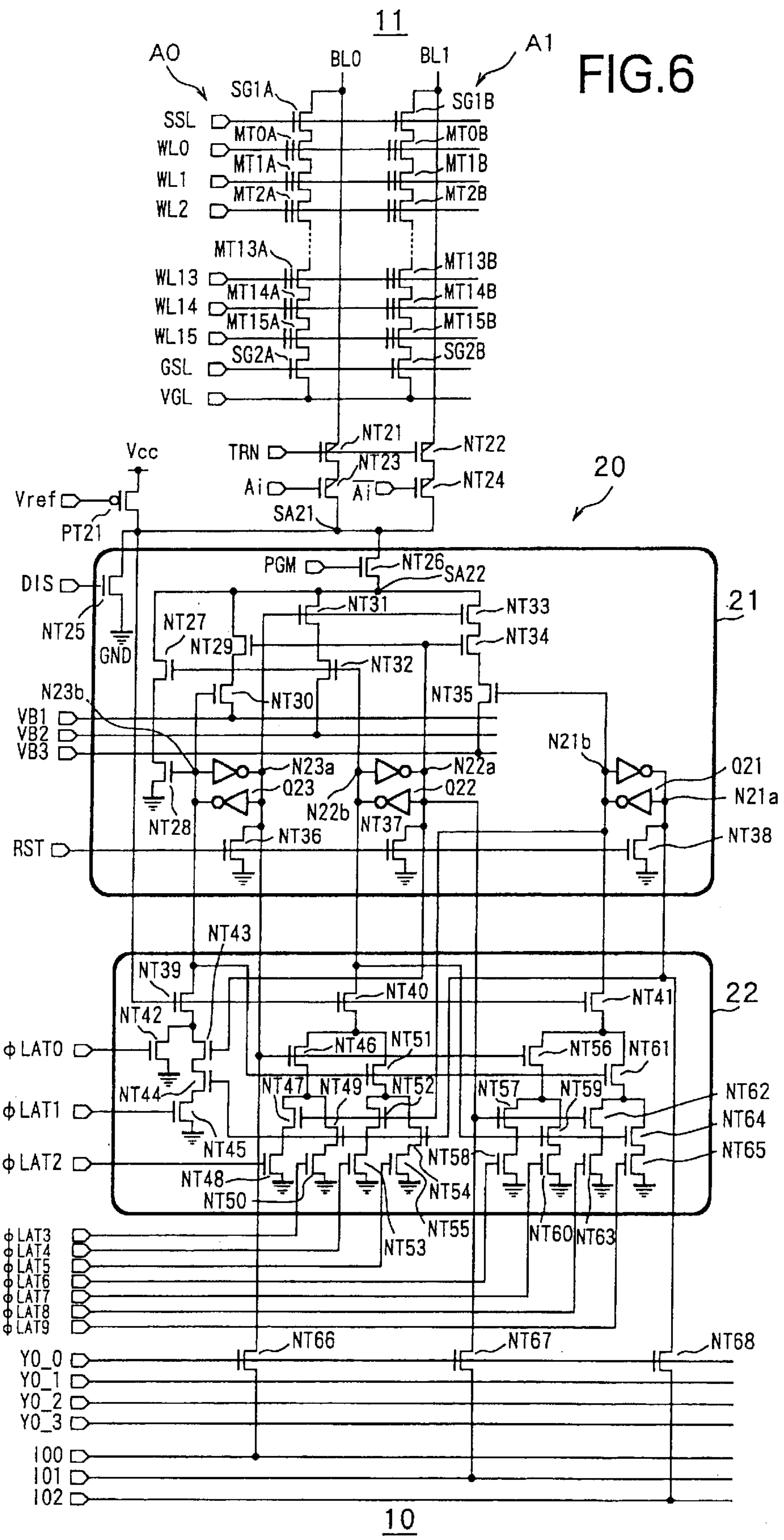
FIG. 6 is a circuit diagram of a first embodiment of a non-volatile semiconductor memory according to the present invention.

FIG. 6 is a circuit diagram of an embodiment of a non-volatile semiconductor memory according to the present invention. The non-volatile semiconductor memory 10 can handle a memory multi-level of eight levels and comprises a memory array 11 and a write/verify/read control circuit 20.

The memory array 11 comprises, as shown in FIG. 6, memory strings A0 and A1 comprised of memory cells respectively connected to common word lines WL0 to WL15. The memory string A0 is connected to a bit line BL0 and the memory string A1 is connected to a bit line BL1.

The memory string A0 comprises a NAND string comprising serially connected memory cell transistors MT0A to MT15A composed of non-volatile semiconductor memories having floating gates. A drain of the memory transistor MT0A of the NAND string is connected to the bit line BL0 via a select gate SG1A, while a source of the memory transistor MT15A is connected to the reference potential line VGL via the select gate SG2A.

The memory string A1 comprises a NAND string comprising serially connected memory cell transistors MT0B to MT15B composed of non-volatile semiconductor memories having floating gates. A drain of the memory cell transistor MT0B of the NAND string is connected to the bit line BL1 via a select gate SG1B, while a source of the memory cell transistor MT15B is connected to the reference potential line VGL via a select gate SG2B.

Gates of the select gates SG1A and SG1B are commonly connected to a select signal supply line SSL, while gates of the select gates SG2A and SG2B are commonly connected to a select signal supply line GSL.

The write/verify/read control circuit 20 comprises NMOS transistors NT21 to NT68, a PMOS transistor PT21, and latch circuits Q21, Q22, and Q23 configured by connecting inputs and outputs of inverters.

A bit line voltage generating circuit 21 of a write operation is composed of NMOS transistors NT25 to NT38 and the latch circuits Q21, Q22, and Q23. A read/verify control circuit 22 is composed of NMOS transistors NT39 to NT65.

High withstand voltage NMOS transistors NT21 and NT23 are serially connected between the node SA21 and the bit line BL0, and high withstand voltage NMOS transistors NT22 and NT24 are serially connected between the node SA21 and the bit line BL1.

An address decode signal Ai is supplied to a gate electrode of the NMOS transistor NT23, and a signal /Ai ("/" indicates inversion) is supplied to a gate electrode of the NMOS transistor NT24. A signal TRN is supplied to gate electrodes of the NMOS transistors NT21 and NT22.

The NMOS transistor NT25 is connected between the node SA21 and a ground line GND, and the PMOS transistor PT21 is connected between the node SA21 and a supply line of the power source voltage Vcc.

A signal DIS is supplied to a gate electrode of the NMOS transistor NT25 and a signal Vref is supplied to a gate electrode of the PMOS transistor PT21.

The NMOS transistors NT26, NT27, and NT28 are connected in series between the node SA21 and the ground line. The NMOS transistors NT29 and NT30 are connected in series between a connecting point (node SA22) of the NMOS transistors NT26 and NT27 and the supply line of the bit line voltage VB1 at writing. Also, the NMOS transistors NT31 and NT32 are connected in series between the node SA22 and the supply line of the bit line voltage VB2 at writing. Furthermore, the NMOS transistors NT33, NT34, and NT35 are connected in series between the node SA22 and the supply line of the bit line voltage VB3 at writing.

A signal PGM is supplied to a gate electrode of the NMOS transistor NT26, gate electrodes of the NMOS transistors NT27 and NT32 are connected to a second memory node N22*b* of the latch circuit Q22, gate electrodes of the NMOS transistors NT28 and NT30 are connected to a second memory node N23*b* of the latch circuit Q23, gate electrodes of the NMOS transistors NT29 and NT34 are connected to a first memory node N22*a* of the latch circuit Q22, gate electrodes of the NMOS transistors NT31 and NT33 are connected to a first memory node N23*a* of the latch circuit Q23, and a gate electrode of the NMOS transistor NT35 is connected to a second memory node N21*b* of the latch circuit Q21.

The NMOS transistor NT36 is connected between the first memory node N23*a* of the latch circuit Q23 and the ground line, the NMOS transistor NT37 is connected between the first memory node N22*a* of the latch circuit Q22 and the ground line, and the NMOS transistor NT38 is connected between the first memory node N21*a* of the latch circuit Q21 and the ground line.

Gate electrodes of the NMOS transistors NT36, NT37, and NT38 are connected to the supply line of the reset signal RST.

A drain of the NMOS transistor NT39 is connected to the second memory node N23*b* of the latch circuit Q23, a drain of the NMOS transistor NT40 is connected to the second memory node N22*b* of the latch circuit Q22, and a drain of the NMOS transistor NT41 is connected to the second memory node N21*b* of the latch circuit Q21.

The NMOS transistor NT42 is connected between a source of the NMOS transistor NT39 and the ground line, and, in parallel with this, the NMOS transistors NT43, NT44, and NT45 are connected in series.

The NMOS transistors NT46 and NT51 are connected in parallel to a source of the NMOS transistor NT40. The NMOS transistors NT47 and NT48 are connected in series between a source of the NMOS transistor NT46 and the ground line, and, in parallel with this, the NMOS transistors NT49 and NT50 are connected in series. The NMOS transistors NT52 and NT53 are connected in series between a source of the NMOS transistor NT51 and the ground line, and, in parallel with this, the NMOS transistors NT54 and NT55 are connected in series.

The NMOS transistors NT56 and NT61 are connected in parallel to a source of the NMOS transistor NT41. The NMOS transistors NT57 and NT58 are connected in series between a source of the NMOS transistor NT56 and the ground line, and, in parallel with this, the NMOS transistors NT59 and NT60 are connected in series. The NMOS transistors NT62 and NT63 are connected in series between a source of the NMOS transistor NT61 and the ground line, and, in parallel with this, the NMOS transistors NT64 and NT65 are connected in series.

Ga te electrodes of the NMOS transistors NT39, NT40, and NT41 are connected to the node SA21. A gate electrode of the NMOS transistor NT43 is connected to the first memory node N22*a* of the latch circuit Q22, and gate electrodes of the NMOS transistors NT44, NT49, and NT54 are connected to the first memory node N21*a* of the latch circuit Q21. Gate electrodes of the NMOS transistors NT46 and NT56 are connected to the first memory node N23*a* of the latch circuit Q23, and gate electrodes of the NMOS transistors NT51 and NT61 are connected to the second memory node N23*b* of the latch circuit Q23. Gate electrodes of the NMOS transistors NT47 and NT52 are connected to the second memory node N21*b* of the latch circuit Q21, gate electrodes of the NMOS transistors NT57 and NT62 are connected to the first memory node N22*a* of the latch circuit Q22, and gate electrodes of the NMOS transistors NT59 and NT64 are connected to the second memory node N22*b* of the latch circuit Q22.

A gate electrode of the NMOS transistor NT42 is connected to the supply line of a signal φLAT0, a gate electrode of the NMOS transistor NT45 is connected to the supply line of a signal φLAT1, a gate electrode of the NMOS transistor NT48 is connected to the supply line of a signal φLAT2, a gate electrode of the NMOS transistor NT50 is connected to the supply line of the signal φLAT3, a gate electrode of the NMOS transistor NT53 is connected to the supply line of a signal φLAT4, a gate electrode of the NMOS transistor NT55 is connected to the supply line of a signal φLAT5, a gate electrode of the NMOS transistor NT58 is connected to the supply line of a signal φLAT 6, a gate electrode of the NMOS transistor NT60 is connected to the supply line of a signal φLAT7, a gate electrode of the NMOS transistor 63 is connected to the supply line of a signal φLAT8, and a gate electrode of the NMOS transistor NT65 is connected to the supply line of a signal φLAT9.

The NMOS transistor NT66 is connected between the first memory node N23*a* of the latch circuit Q23 and a bus line IO0, the NMOS transistor NT67 is connected between the first memory node N22*a* of the latch circuit Q22 and a bus line IO1, and the NMOS transistor NT68 is connected between the first memory node N21*a* of the latch circuit Q21 and a bus line IO2.

Gate electrodes of the NMOS transistors NT66, NT67, and NT68 as column gates are connected to a supply line of a signal Y0-0.

Next, the write, verify read, and read operations according to the above configuration will be explained in order with reference to the drawings.

Figures 7A, 7B, 7C:
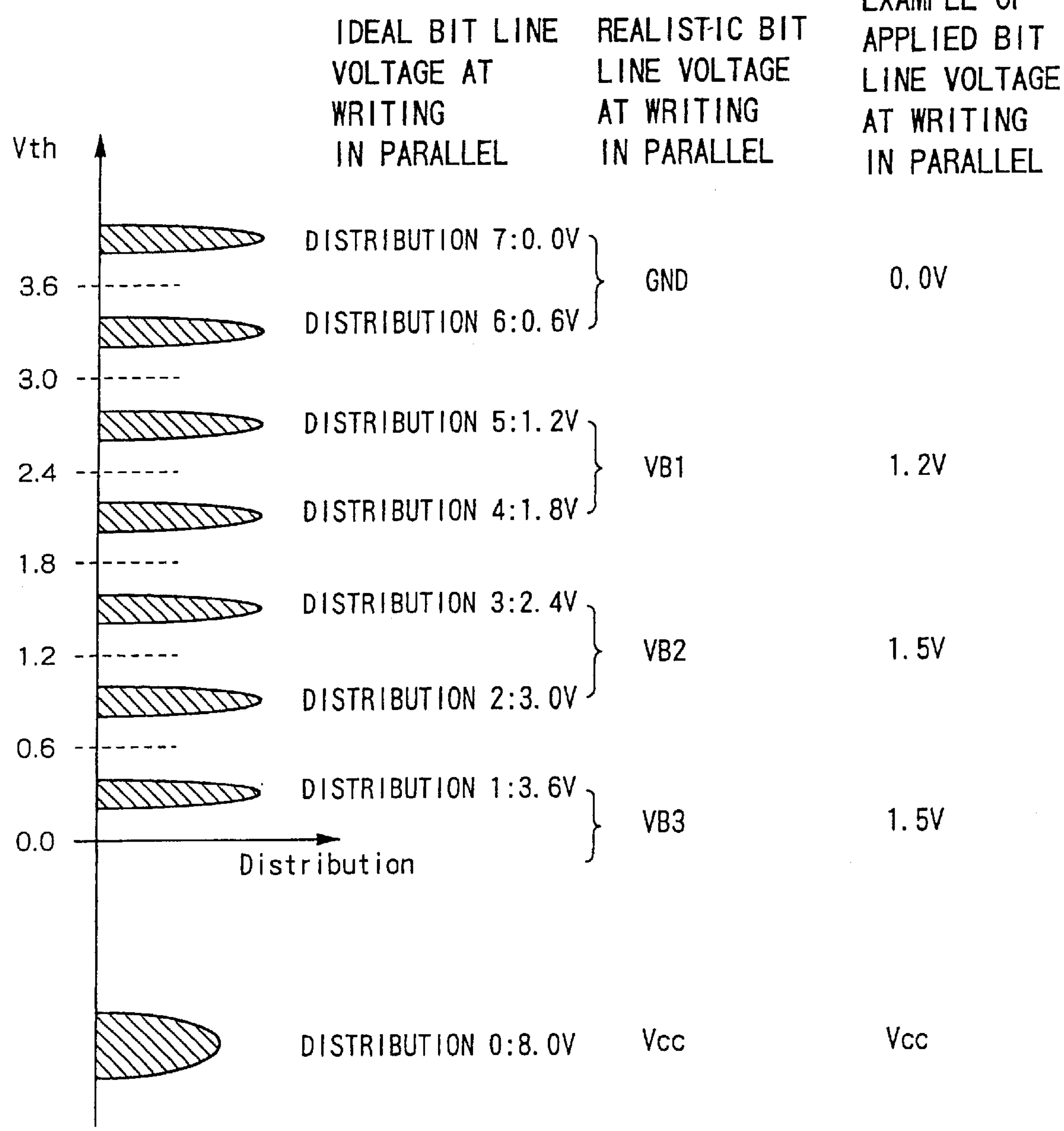
FIGS. 7A, 7B and 7C, is a view for explaining a writing sequence of the circuit of FIG. 6.
Figure 8:
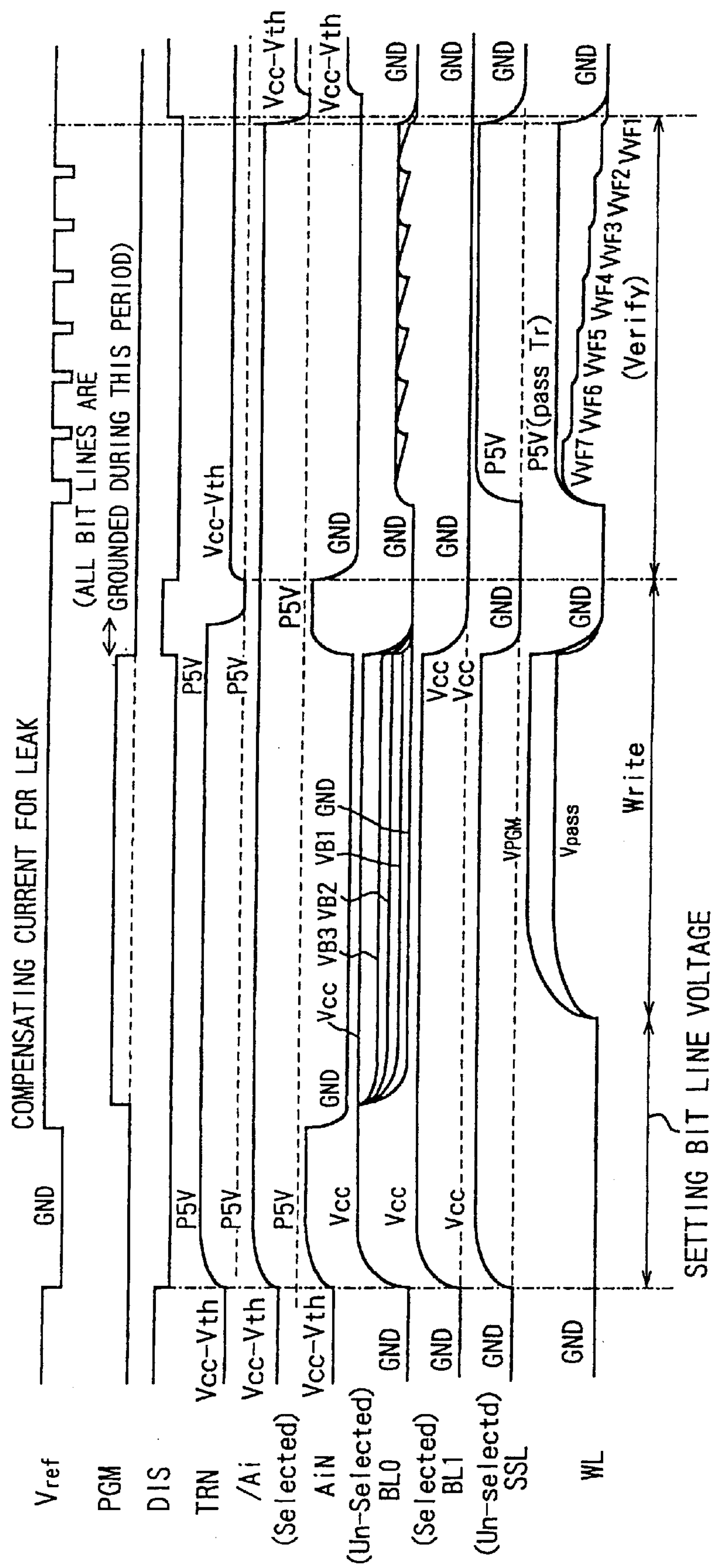
FIG. 8 is a timing chart for explaining a write operation of the circuit of FIG. 6.

The write operation will be explained with reference to the timing charts of FIGS. 7 and 8.

First, a bit line voltage which should be set at a write operation will be explained with reference to FIG. 7.

To perform a write operation of eight-level data at a high speed, it is effective to write all of the data simultaneously. At that time, if the bit line voltage is set in accordance with the write data, for example, as shown in FIG. 7A, to be {distribution 0:8.0V}, {distribution 1:3.6V}, {distribution 2:3.0V}, {distribution 3:2.4V}, {distribution 4:1.8V}, {distribution 5:1.2V}, {distribution 6:0.6V}, and {distribution 7:0.0V} corresponding to the respective distributions 0 to 7, a cell having the larger shift of threshold voltage Vth receives the higher electric field. As a result, the writing is completed approximately simultaneously at all the levels.

In reality, however, in view of so-called self-boost or local self-boost, an applicable voltage to a channel via the bit lines BL0 and BL1 depends on the threshold voltage VthDSG of the select gates SG1A and SG1B on the bit lines BL0 and BL1 side of the memory strings A0 and A1. When assuming a voltage to be applied to the gate electrodes of the select gates SG1A and SG1B at writing is a power source voltage Vcc, the upper limit of the voltage applicable to the bit line is a voltage with a margin from (Vcc-VthDSG), for example, 1.5V.

Also, it is necessary that the eight-level latch fit in a few bit lines' worth of pitch, so it is preferable in terms of a circuit scale and reduction of the layout area to set one bit line voltage by a plurality of data, that is, {distribution 0:Vcc}, {distribution 1:VB3}, {distribution 2,3:VB2}, {distribution 4,5:VB1}, and {distribution 6, 7:GND}, as shown in FIG. 7B.

Accordingly, at the time of the actual writing, voltages such as {distribution 0:Vcc}, {distribution 1:1.5V}, {distribution 2,3:1.5V}, {distribution, 5:1.2V}, and {distributions 6, 7:0.0} as shown in FIG. 7C are applied in accordance with the write data.

Next, a specific write operation will be explained.

At the time of stand-by, a signal PGM is set at a low level (ground level), the NMOS transistor NT26 is held in the non-conductive state, and the bit lines BL0 and BL1 are detached from the latch circuits Q21 to Q23.

A signal DIS is set at a high level (Vcc level) and signals TRN, Ai, and /Ai are set to be (Vcc-Vth). Due to this, the NMOS transistors NT25 and NT21 to NT24 are held in the conductive state, and the bit lines BL0 and BL1 are set at the ground level.

When the write operation is started at this state, the signal Y0-0 is set at a high level, the NMOS transistors NT66 to NT68 are held in the conductive state, and the write data is fetched to the latch circuits Q21 to Q23 and stored.

Then, the signal DIS is switched to a low level and the bit lines BL0 and BL1 are detached from the ground line. Then, the signal Vref is set to a low level, the signals TRN, Ai, and /Ai are set at about 5V, and the PMOS transistor PT21 is held in the conductive state. As a result, all bit lines are charged by the power source voltage Vcc.

At this time, in order not to influence the latch data, the signal PGM, and signals φLAT0 to φLAT9 for controlling read/verify operation are set at the ground level (low level) and the NMOS transistors NT42, NT45, NT48, NT50, NT53, NT55, NT58, NT60, NT63, and NT65 are held in the non-conductive state.

Also, the select signal supply line SSL connected to the gate electrodes of the select gates SG1A and SG1B on the drain side of the memory cell is set at the power source voltage Vcc level.

Then, NMOS transistors for connection on the side not selected by the address decode signal Ai, for example, the signal /Ai supplied to the gate electrode of the NMOS transistor NT24, are set at a low level, and the NMOS transistor NT24 is switched to be the non-conductive state and held in a floating state while the bit line BL1 is charged by the power source voltage Vcc.

After the above, the signal Vref is switched to the power source voltage Vcc level, the PMOS transistor PT21 for so-called precharging is held in the non-conductive state, the signal PGM is set at a high level, the NMOS transistor NT26 is switched to be the conductive state, the selected bit line BL0 is connected to the latch circuits Q21 to Q23, and the selected bit line BL0 is set at a voltage corresponding to the write data.

For example, when the write data is "00x (x:0 or 1)", both of the second memory nodes N23*b* and N22*b* of the latch circuits Q23 and Q22 are at a high level. Therefore, the NMOS transistors NT27 and NT28 are held in the conductive state. As a result, the bit line BL0 is discharged to the ground level.

When the write data is "01x", both of the second memory node N23*b* of the latch circuit Q23 and the first memory node N22*a* of the latch circuit Q22 are at a high level. Therefore, the NMOS transistors NT29 and NT30 are held in the conductive state. As a result, the node SA21 is connected to the supply line of the bit line voltage VB1. Thus, the bit line BL0 is set to VB1 (for example, 1.2V).

When the write data is "10x", both of the first memory node N23a of the latch circuit Q23 and the second memory node N22b of the latch circuit Q22 are at a high level. Accordingly, the NMOS transistors NT31 and NT32 are held in the conductive state. As a result, the node SA21 is connected to the supply line of the bit line voltage VB2. Therefore, the bit line BL0 is set to be VB2 (for example, 1.5V).

When the write data is "110", both of the first memory nodes N23a and N22a of the latch circuits Q23 and Q22 are at a high level, and the second memory node N21b of the latch circuit Q21 is at a high level. Accordingly, the NMOS transistors NT33 to NT35 are held in the conductive state. Therefore, the bit line BL0 is set to be VB3 (for example, 1.5V).

When the write data is "111", the second memory nodes N23b, N22b, and N21b of the latch circuits Q23, Q22 and Q21 are at a low level. Accordingly, the NMOS transistors NT28, NT30, NT32, and NT35 are held in the non-conductive state. As a result, the node SA21 is not connected to any of the bit line voltage supply lines. Therefore, the bit line BL0 is held at the level of the power source voltage Vcc, that is, a precharge voltage.

After the selected bit line BL0 is set at a voltage corresponding to the write data by the above process, selected word lines WL are set at a write voltage VPGM, unselected word lines are set at a write path voltage Vpass (<VPGM), and the write operation is performed.

At this time, the channel of the memory cell of the memory string A1 connected to the unselected bit lines BL1 and the channels of the memory cell having the write data of "111" are detached from the bit line BL1 and BL0 by the select gates SG1B and SG1A on the drain side, and a write operation is not performed due to being boosted to a non-write potential by capacitive coupling with the word lines.

As a result, in order to simultaneously write all the data instead of writing each data for every step as in the related art, the number of ISPP pulses is reduced until all of the data is judged to be sufficiently written. Therefore, reduction of the write time is realized.

Figure 9:
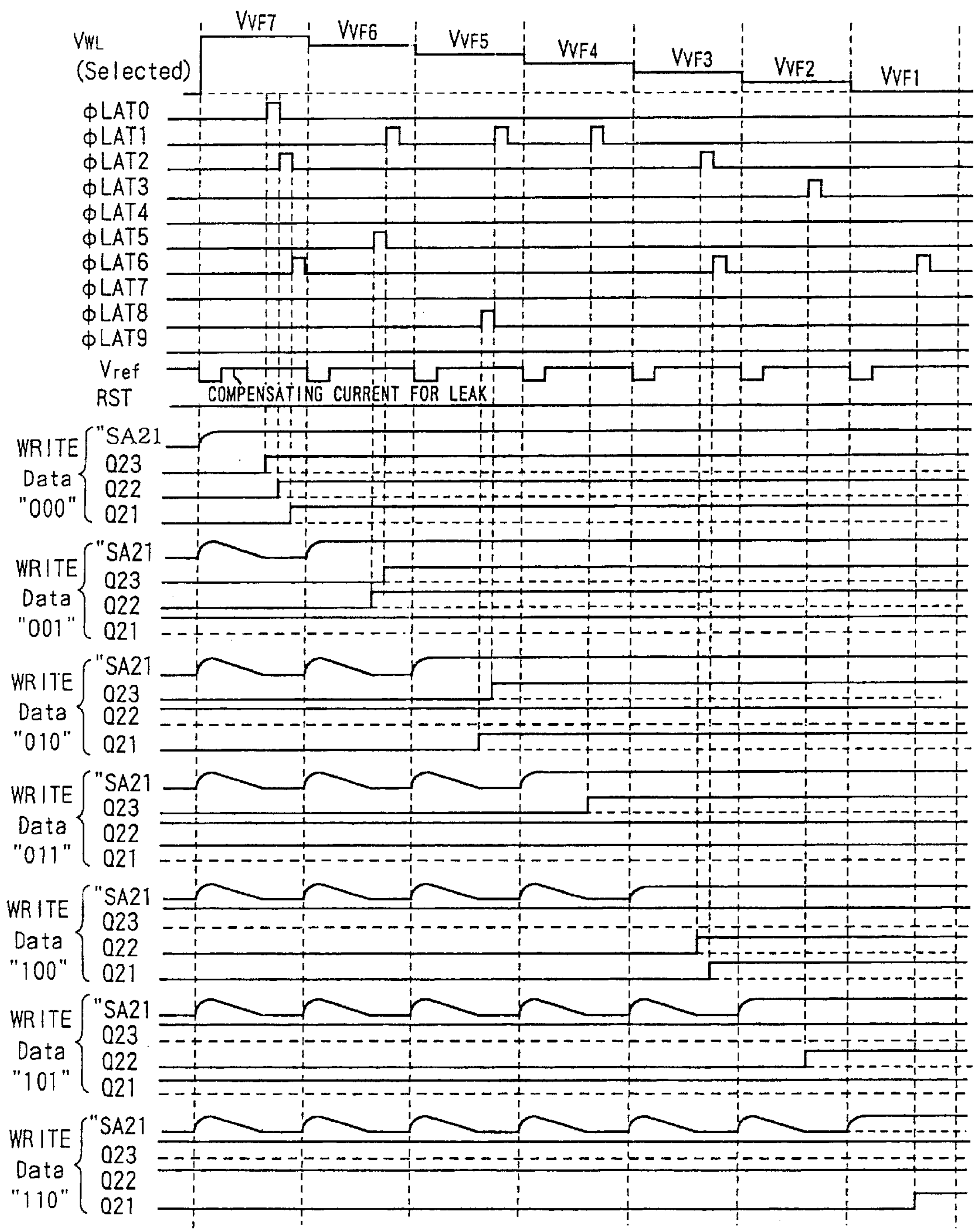
FIG. 9 is a timing chart for explaining a verify read operation of the circuit of FIG. 6.

Next, a verify read operation will be explained with reference to the timing chart of FIG. 9.

In the verify operation, a write check of "000", "001", "010", "011", "100", "101", and "110" is carried out every time one write operation is completed.

In the present embodiment, the verify operation is carried out from the higher level. Namely, the word line voltage is reduced gradually, VVF7→VVF6→VVF5→VVF4→VVF3→VVF2→VVF1.

Below, the verify operation will be explained specifically.

First, the signal Vref is set at a low level (ground level) and the PMOS transistor PT21 is held in the conductive state. The signal TRN is set at about 2V. Due to this, the node SA21 is charged at the power source voltage Vcc level and the potential of the bit line voltage is charged to be the voltage lowered from the level of the signal TRN (about 2V) by exactly the amount of the threshold voltage Vth (for example, at about 1V: the NMOS transistor NT21 is cut off after charging).

Simultaneously with this, the select signal supply line SSL connected to the gate electrodes of the select gates SA1A and SA1B on the drain side is set at the same voltage as the unselected word lines of the selected string (a voltage of P5V:5.0 to 6.0V).

At the stage when the charging is completed, the write status of the memory cell is reflected to the bit line BL0 and the node SA21. At this time, the bit line BL0 is charged at 1V and the node SA21 is charged at the power source voltage Vcc level and the NMOS transistor NT21 automatically becomes the non-conductive state.

Here, the signal Vref is set at a voltage so that the PMOS transistor PT21 can pass a current enough to compensate for a leak current of the bit line, for example, at about 2V. A voltage of P5V is applied to the word line of the unselected memory cell and a voltage of VVF7 is applied to the word line connected to the selected cell.

When the threshold voltage Vth of the memory cell is larger than the word line voltage VVF7 (Vth>VVF7) as a result of judgement of the verify read operation when the word line voltage is at VVF7, that is, the write data is "000", the node SA21 is held at the power source voltage Vcc because a cell current does not flow. At this time, the NMOS transistors NT39 to NT41 are held in the conductive state.

After a certain time, the pulse signals φLAT0, φLAT2, and φLAT6 a re set at a high level in order.

While the signal φLAT0 is at a high level, the NMOS transistor NT42 is switched to be conductive. Since the NMOS transistor NT39 is in the conductive state at this time, the second memory node N23b of the latch circuit Q23 is inverted to a low level and the first memory node N23a is inverted to a high level.

While the signal φLAT2 is at a high level, the NMOS transistor NT48 is switched to the conductive state. Since the NMOS transistor NT40 is in the conductive state at this time and the first memory node N23a of the latch circuit Q23 is inverted to a high level , the NMOS transistor NT46 is held in the conductive state. Also, since the second memory node N21b of the latch circuit Q21 is at a high level, the NMOS transistor NT47 is held in the conductive state.

As a result, the second memory node N22b of the latch circuit Q22 is inverted to a low level and the first memory node N22a is inverted to a high level.

While the signal φLAT6 is at a high level, the NMOS transistor NT58 is switched to the conductive state. Since the NMOS transistor NT41 is in the conductive state and the first memory node N23a of the latch circuit Q23 is inverted to a high level, the NMOS transistor NT56 is held in the conductive state. Also, since the first memory node N22a of the latch circuit Q22 is inverted to a high level, the NMOS transistor NT57 is held in the conductive state.

As a result, the second memory node N21b of the latch circuit Q21 is inverted to a low level and the first memory node N21a is inverted to a high level.

As explained above, when a threshold voltage Vth is larger than a word line voltage VVF7 (Vth>VVF7) in the memory cell having the write data "000", the latch data (level of the first memory node) of the latch circuits Q23, Q22 and Q21 is inverted to "111". Rewriting after above operation, the bit line BL0 is boosted to the potential of the power source voltage Vcc and the channel is boosted to the non-write potential, therefore, the write operation is not carried out.

On the other hand, if the threshold voltage Vth is less than the word line voltage VVF7 (Vth<VVF7), a cell current larger than the leak compensation current flows, and the bit line voltage falls, the NMOS transistors NT21 and NT22 become the conductive state, a re-distribution of electrical charges occurs between the capacity CBL of the bit line (about 1V) and the capacity CSA (<<CBL) of the node SA21

(power source voltage Vcc), and the voltage of the node SA21 becomes 1V or about the same as that of the bit line.

After a certain time, the pulse signals φLAT0, φLAT2, and φLAT6 are set at a high level one after another.

While the signal φLAT0 is at a high level, a certain amount of current is necessary for the inversion of a stable latch circuit. During this time, the NMOS transistor NT42 is held completely in the conductive state. The gate voltage of the NMOS transistor NT39 is about 1V, the current value is small despite being turned "on", furthermore, the voltage VDS between the drain and source of the NMOS transistor NT39 becomes larger. As a result, the latch circuit Q23 cannot be inverted, so that the second memory node N23*b* is held at a high level and the first memory node N23*a* is held at a low level.

While the signal φLAT2 is at a high level, since the first memory node N23*a* of the latch circuit Q23 is held at a low level, the NMOS transistor NT46 is held in the non-conductive state. As a result, the latch circuit Q22 cannot be inverted, the second memory node N22*b* is held at a high level, and the first memory node N22*a* is held at a low level.

While the signal φLAT6 is at a high level, since the first memory nodes N23*a* and N22*a* of the latch circuits Q23 and Q22 are held at a low level, the NMOS transistors NT56 and NT57 are held in the non-conductive state. As a result, the latch circuit Q21 cannot be inverted, the second memory node N21*b* is held at a high level, and the first memory node N21*a* is held at a low level.

As explained above, when a threshold voltage Vth is less than the word line voltage VVF7 (Vth<VVF7) in a memory cell having the write data "000", the latch data (level of the first memory node) of the latch circuit Q23, Q22 and Q21 remain unchanged at "000", and a write operation is performed when the bit line voltage is set at a write potential at the time of re-writing.

Next, a voltage VVF6 is applied to the word line connected to the selected cell.

As a result of judgement of a verify read operation with the word line voltage VVF6, that is, the write data "001", when the threshold voltage Vth of the memory cell is larger than the word line voltage VVF6 (Vth>VVF6), the node SA21 is held at the power source voltage Vcc because a cell current does not flow. At this time, the NMOS transistors NT39 to NT41 are held in the conductive state.

After a certain time, signals φLAT5 and φLAT1 are set at a high level in order.

Note that a cell having the write data "000" (VVF7>Vth>VVF6) is also included in this case, and the latch data of the latch circuits Q23, Q22, and Q21 must not be inverted in the cells.

When the latch data is "001" and the threshold voltage Vth of a memory cell is larger than the word line voltage VVF6 (Vth>VVF6), the second memory nodes N23*b* and N22*b* of the latch circuits Q23 and Q22 are held at a high level, the first memory nodes N23*a* and N22*a* are held at a low level, the second node N21*b* of the latch circuit Q21 is held at a low level, and the first memory node N21*a* is held at a high level.

In this state, while the signal φLAT5 is at a high level, the NMOS transistor NT55 is switched to the conductive state. At this time, since the NMOS transistor NT40 is in the conductive state and the second node N23*b* of the latch circuit Q23 is at a high level, the NMOS transistor NT51 is held in the conductive state. Also, since the first memory node N21*a* of the latch circuit Q21 is at a high level, the NMOS transistor NT54 is held in the conductive state.

As a result, the second memory node N22*b* of the latch circuit Q22 is inverted to a low level and the first memory node N22*a* is inverted to a high level.

While the signal φLAT1 is at a high level, the NMOS transistor NT45 is switched to in the conductive state. At this time, since the NMOS transistor NT39 is in the conductive state and the first memory node N22*a* of the latch circuit Q22 is inverted to a high level, the NMOS transistor NT43 is held in the conductive state. Also, since the first memory node N21*a* of the latch circuit Q21 is at a high level, the NMOS transistor NT44 is held in the conductive state.

As a result, the second memory node N23*b* of the latch circuit Q23 is at a low level and the first memory node N23*a* is inverted to a high level.

As explained above, when a threshold voltage Vth is larger than the word line voltage VVF6 (Vth>VVF6) in a memory cell having the write data "001", the latch data (level of the first memory node) of the latch circuits Q23, Q22 and Q21 is inverted to "111". The bit line BL0 is boosted to the power source voltage Vcc and the channel is boosted to the non-write potential in a rewrite operation after this, so the write operation is not carried out.

Also, when the threshold voltage Vth is larger than the word line voltage VVF6 (Vth>VVF6) in a memory cell having the write data "000", the second memory nodes N23*b*, N22*b*, and N21*b* of the latch circuits Q23, Q22, and Q21 are held at a high level and the first memory node N23*a*, N22*a*, and N21*a* are held at a low level.

Accordingly, while the signal φLAT5 is at a high level, since the first memory node N21*a* of the latch circuit Q21 is at a low level, the NMOS transistor NT54 is held in the non-conductive state, the second memory node N22*b* of the latch circuit Q22 is held at a high level, and the first memory node N22*a* is held at a low level.

While the signal φLAT1 is at a high level, since the first memory node N22*a* and N21*a* of the latch circuits Q22 and Q21 are held at a low level, the NMOS transistors NT43 and NT44 are held in the non-conductive state, the second memory node N23*b* of the latch circuit Q23 is held at a high level, and the first memory node N23*a* is held at a low level.

As a result of the above, when the threshold voltage Vth is larger than the word line voltage VVF6 (Vth>VVF6) in a memory cell having the write data "000", the latch data (level of the first memory node) of the latch circuits Q23, Q22, and Q21 remain unchanged at "000". A write operation is performed by setting the bit line voltage at the write potential at the time of rewriting.

When the threshold voltage Vth is less than the word line voltage VVF6 (Vth<VVF6) in a memory cell having the write data "001", a cell current larger than the leak compensate current flows, the bit line voltage falls, the NMOS transistor NT21 becomes the conductive state, a re-distribution of electric charges between the capacity CBL of the bit line (about 1V) and the capacity CSA (<<CBL) of the node SA21 (power source voltage Vcc) occurs, and the voltage of the node SA21 becomes 1V which is almost as same as that of bit line voltage.

After a certain time, the pulse signals φLAT5 and φLAT1 are set to a high level in order.

While the signal φLAT5 is at a high level, a certain amount of current is necessary for inversion of a stable latch circuit. During this time, the NMOS transistor NT55 is held completely in the conductive state. However, the gate voltage of the NMOS transistor NT40 is about 1V. The current value is small despite being turned "on". Furthermore, the voltage VDS between the drain and source of the NMOS transistor NT40 becomes large when a current flows. In the end, the latch circuit Q22 cannot be inverted, the second memory node N22b is held at a high level, and the first memory node N22a is held at a low level.

While the signal ϕLAT1 is at a high level, since the first memory node N22a of the latch circuit Q22 is held at a low level, the NMOS transistor NT43 is held in the non-conductive state. As a result, the latch circuit Q23 cannot be inverted, the second memory node N23b is held at a high level, and the first memory node N23a is held at a low level.

To sum up, only when the threshold Vth is larger than the word line voltage VVF6 (Vth>VVF6) in a memory cell having the write data "001" is the latch data (level of the first memory node) of the latch circuits Q23, Q22, and Q21 inverted to "111". In other cases, the latch data (level of the first memory node) of the latch circuits Q23, Q22, and Q21 is unchanged, and at the time of rewriting, the bit line voltage is set to a write potential and a write operation is carried out.

The rest of the controlling is performed as explained below in the same way as above.

When a word line voltage is VVF5, only in the case where the threshold voltage Vth is larger than the word line voltage VVF5 (Vth>VVF5) in the memory cell having the write data "010" is control performed so that the latch data (level of the first memory node ) of the latch circuits Q23, Q22, and Q21 is inverted to "111".

When the word line voltage is WF4, only in the case where the threshold voltage Vth is larger than the word line voltage VVF4 (Vth>VVF4) in the memory cell having the write data "011" is control performed so that the latch data (level of the first memory node ) of the latch circuits Q23, Q22, and Q21 is inverted to "111".

When the word line voltage is VVF3, only in the case where the threshold voltage Vth is larger than the word line voltage VVF3 (Vth>VVF3) in the memory cell having the write data "100" is control performed so that the latch data (level of the first memory node) of the latch circuits Q23, Q22, and Q21 is inverted to "111".

When the word line voltage is VVF2, only in the case where the threshold voltage Vth is larger than the word line voltage VVF2 (Vth>VVF2) in the memory cell having the write data "101" is control performed so that the latch data (level of the first memory node ) of the latch circuits Q23, Q22, and Q21 is inverted to "111".

When the word line voltage is VVF1, only in the case where the threshold voltage Vth is larger than the word line voltage VVF1 (Vth>VVF1) in the memory cell having the write data "110" is control performed so that the latch data (level of the first memory node ) of the latch circuits Q23, Q22 and Q21 is inverted to "111".

At the stage where verification at the word line voltage VVF1 is completed, a wired-OR is carried out on the inverted signal of all latch data. If there is at least one "0" (inverted data is "1"), the result of the wired-OR becomes a low level and the procedure proceeds to the re-writing process. If all data is "1" (inverted data is "0"), the write operation ends.

The above cycle of writing and verifying is repeated until all memory cells are judged to be sufficiently written in or until reaching a set number of times.

Figure 10:
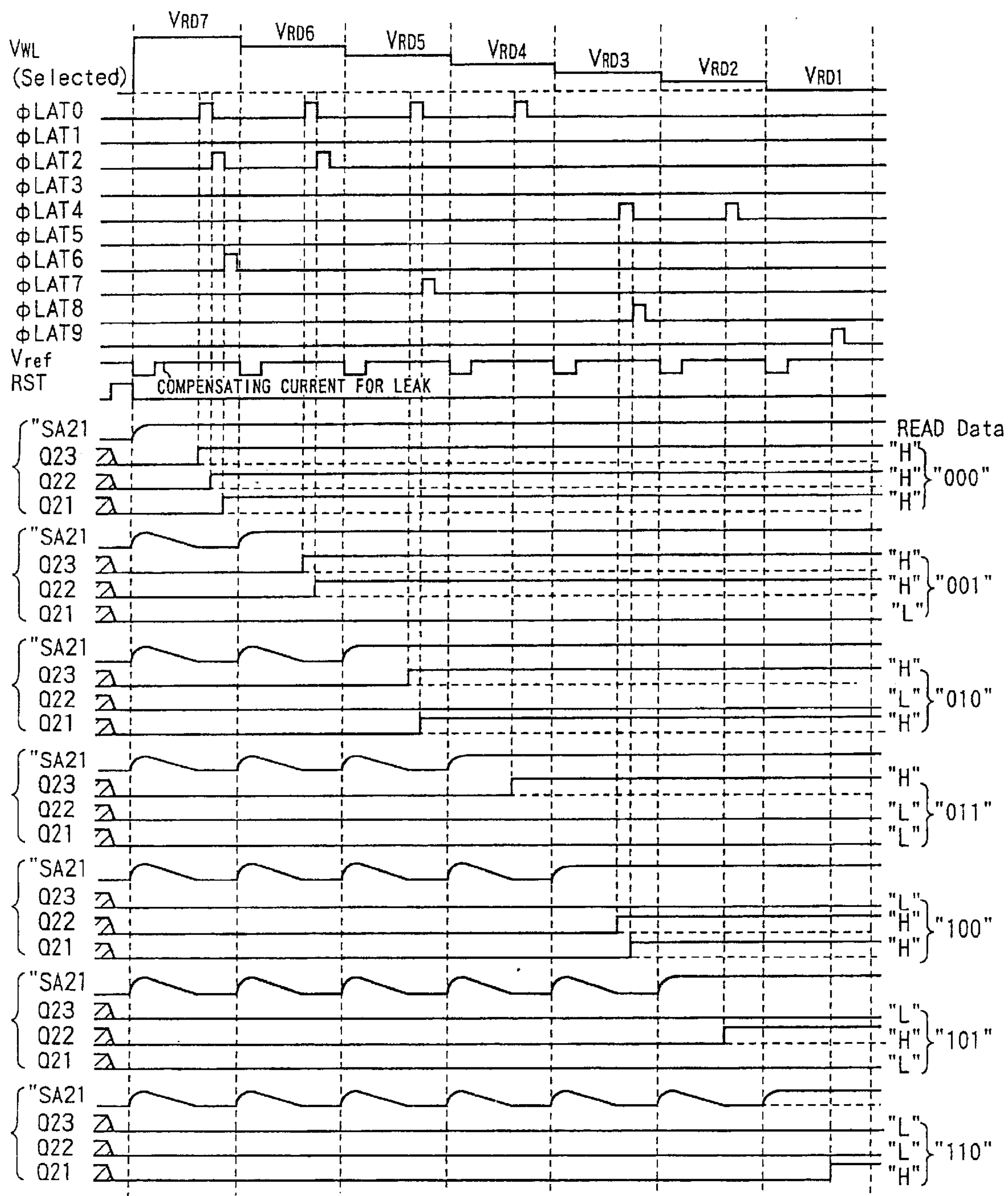
FIG. 10 is a timing chart for explaining a read operation of the circuit of FIG. 6.

Next, a normal read operation will be explained with reference to the timing chart of FIG. 10. Note that the explanation will be made of the case where an address code signal Ai is in a selected state.

When a normal read operation is started, a reset signal RST is set to a high level for a certain period and the latch data of the latch circuits Q23, Q22, and Q21 are reset to a low level.

A read operation is performed by lowering the word line voltage in order, that is, VRD7→VRD6→VRD5→VRD4→VRD3→VRD2→VRD1.

Then, in the same way as in the above verifying operation, a signal Vref is set at a low level (ground level) and the PMOS transistor PT21 is held in the conductive state prior to the read operations at the respective word line voltages. Also, a signal TRN is set at about 2V. Due to this, the node SA21 is charged at the power source voltage Vcc level, and the potential of the bit line is charged to a voltage lowered from the level of the signal TRN (about 2V) by the amount of the threshold voltage Vth (for example, about 1V: the NMOS transistor NT21 is cut off after charging).

At the same time, the select signal supply line SSL connected to the gate electrodes of the select gates SG1A and SG1B on the drain side is set at the same voltage as that of unselected word lines of the selected string (a voltage of P5V:5.0 to 6.0V).

At the stage where the charging is completed, the write status of the memory cells is reflected on the bit line BL0 and the node SA21. At this time, the bit line BL0 is charged to 1V, the node SA21 is charged at the power source voltage Vcc, and the NMOS transistor NT21 automatically becomes the non-conductive state.

Here, the signal Vref is set to a voltage which can pass a current for compensating for a leak current of the bit line to the PMOS transistor PT21, for example, at about 2V. A voltage of P5V is applied to the word line of the non-selected memory cells and a voltage of VRD7 is applied to the word line connected to the selected cell.

In the case where the threshold voltage Vth is larger than the word line voltage VRD7 (Vth>VRD7) as the result of the read operation with the word line voltage of VRD7, since a cell current does not flow, the node SA21 is held at the power source voltage Vcc. At this time, the NMOS transistors NT39 to NT41 are held in the conductive state.

After a certain time, the pulse signals ϕLAT0, ϕLAT2, and ϕLAT6 are set to a high level in order.

While the signal PLATO is at a high level, the NMOS transistor NT42 is switched to a conductive state. At this time, since the NMOS transistor is in the conductive state, the second memory node N23b of the latch circuit Q23 is inverted to a low level and the first memory node N23a is inverted to a high level.

While the signal ϕLAT2 is at a high level, the NMOS transistor NT48 is switched to the conductive state. At this time, since the NMOS transistor NT40 is in the conductive state and the first memory node N23a of the latch circuit Q23 is inverted to a high level, the NMOS transistor NT46 is held in the conductive state, while since the second memory node N21b of the latch circuit Q21 is at a high level, the NMOS transistor NT47 is held in the conductive state.

As a result, the second memory node N22b of the latch circuit Q22 is inverted to a low level and the first memory node N22a is inverted to a high level.

While the signal ϕLAT6 is at a high level, the NMOS transistor NT58 is switched to the conductive state. At this time, since the NMOS transistor NT41 is in the conductive state and the first memory node N23a of the latch circuit Q23 is inverted to a high level, the NMOS transistor NT56 is held in the conductive state. Also, since the first memory node N22*a* of the latch circuit Q22 is inverted to a high level, the NMOS transistor NT57 is held in the conductive state.

As a result, the second memory node N21*b* of the latch circuit Q21 is inverted to a low level and the first memory node N21*a* is inverted to a high level.

From the above, in the case where the threshold voltage Vth of the memory cell is larger than the word line voltage VRD7 (Vth>VRD7), the latch data (level of the first memory node) of the latch circuits Q23, Q22, and Q21 are inverted to "111".

On the other hand, when the threshold voltage Vth of the memory cell is less than the word line voltage VRD7 (Vth<VRD7), a current larger than the leak compensate current flows, the bit line voltage falls, the NMOS transistor NT21 becomes the conductive state, a redistribution of electrical charges occurs between the capacity CBL of the bit line (about 1V) and the capacity CSA (<<CBL) of the node SA21 (power source voltage Vcc), and the voltage of the node SA21 becomes 1V or about the same as that of the bit line.

After a certain time, the pulse signals ϕLAT0, ϕLAT2, and ϕLAT6 are set at a high level in order.

While the signal ϕLAT0 is at a high level, a certain amount of current is necessary for the inversion of a stable latch circuit. During this time, the NMOS transistor NT42 is held completely in the conductive state. The gate voltage of the NMOS transistor NT39 is about 1V, the current value is small despite being turned "on", furthermore, the voltage VDS between the drain and source of the NMOS transistor NT39 becomes larger. As a result, the latch circuit Q23 cannot be inverted, so the second memory node N23*b* is held at a high level and the first memory node N23*a* is held at a low level.

While the signal ϕLAT2 is at a high level, since the first memory node N23*a* of the latch circuit Q23 is held at a low level, the NMOS transistor NT46 is held in the non-conductive state. As a result, the latch circuit Q22 cannot be inverted, the second memory node N22*b* is held at a high level, and the first memory node N22*a* is held at a low level.

While the signal ϕLAT6 is at a high level, since the first memory nodes N23*a* and N22*a* of the latch circuits Q23 and Q22 are held at a low level, the NMOS transistors NT56 and NT57 are held in the non-conductive state. As a result, the latch circuit Q21 cannot be inverted, the second memory node N21*b* is held at a high level, and the first memory node N21*a* is held at a low level.

As a result of the above, when a threshold voltage Vth of the memory cell is less than the word line voltage VRD7 (Vth<VRD7), the latch data (level of the first memory node) of the latch circuits Q23, Q22, and Q21 remain unchanged at "000".

Next, a voltage VRD6 is applied to the word line connected to the selected cell.

As a result of the read operation with the word line voltage at VRD6, when the threshold voltage Vth of the memory cell is larger than the word line voltage VRD6 (Vth>VRD6), the node SA21 is held at the power source voltage Vcc level because a cell current does not flow. At this time, the NMOS transistors NT39 to NT41 are held in the conductive state.

After a certain time, the pulse signals ϕLAT0 and ϕLAT2 are set at a high level in order.

While the signal ϕLAT0 is at a high level, the NMOS transistor NT42 is switched to the conductive state. Since the NMOS transistor NT39 is in the conductive state at this time, the second memory node N23*b* of the latch circuit Q23 is inverted to a low level and the first memory node is inverted to a high level.

While the signal ϕLAT2 is at a high level, the NMOS transistor NT48 is switched to the conductive state. Since the NMOS transistor NT40 is in the conductive state at this time and the first memory node N23*a* of the latch circuit Q23 is inverted to a high level, the NMOS transistor NT46 is held in the conductive state. Also, since the second memory node N21*b* of the latch circuit Q21 is at a high level, the NMOS transistor NT47 is held in the conductive state.

As a result, the second memory node N22*b* of the latch circuit Q22 is inverted to a low level and the first memory node N22*a* is inverted to a high level.

As explained above, when the threshold voltage Vth of the memory cell is larger than the word line voltage VRD6 (Vth>VRD6), the latch data (level of the first memory node) of the latch circuits Q23, Q22, and Q21 is inverted to "110".

When the threshold voltage Vth is less than the word line voltage VRD6 (Vth<VRD6), a cell current larger than the leak compensation current flows, and the bit line voltage falls, the NMOS transistor NT21 becomes the conductive state, a re-distribution of electrical charges occurs between the capacity CBL of the bit line (about 1V) and the capacity CSA (<<CBL) of the node SA21 (power source voltage Vcc), and the potential of the voltage of the node SA21 becomes 1V or about the same as that of the bit line.

After a certain time, the pulse signals ϕLAT0 and ϕLAT2 are set at a high level in order.

While the signal ϕLAT0 is at a high level, a certain amount of current is necessary for the inversion of a stable latch circuit. During this time, the NMOS transistor NT42 is held completely in the conductive state, the gate voltage of the NMOS transistor NT39 is about 1V, the current value is small despite being turned "on", furthermore, the voltage VDS between the drain and source of the NMOS transistor NT39 becomes larger when a current flows. As a result, the latch circuit Q23 cannot be inverted, so that the second memory node N23*b* is held at a high level and the first memory node N23*a* is held at a low level.

While the signal ϕLAT2 is at a high level, since the first memory node N23*a* of the latch circuit Q23 is held at a low level, the NMOS transistor NT46 is held in the non-conductive state. As a result, the latch circuit Q22 cannot be inverted, the second memory node N22*b* is held at a high level, and the first memory node N22*a* is held to remain at a low level.

As a result of the above, when the threshold voltage Vth in the memory cell is less than the word line voltage VRD6 (Vth<VRD6), the latch data (level of the first memory node) of the latch circuits Q23, Q22, and Q21 remain unchanged at "000".

Next, a voltage VRD5 is applied to the word line connected to the selected cell.

As a result of the read operation with the word line voltage at VRD5, when the threshold voltage Vth of the memory cell is larger than the word line voltage VRD5 (Vth>VRD5), the node SA21 is held at the power source voltage Vcc because a cell current does not flow. At this time, the NMOS transistors NT39 to NT41 are held in the conductive state.

Here, the following cases can be considered as the latch data.

1. When Vth>VRD7: latch data is "111"
2. when VRD7>Vth>VRD6: latch data is "110"

3. When VRD6>Vth>VRD5: latch data is "000"

Here, only in the case of 3, the first memory nodes N23*a* and N21*a* of the latch circuits Q23 and Q21 are inverted to a high level. At this time, control is necessary so that the first memory node N21*a* of the latch circuit Q21 in the case of 2 is not inverted to a high level.

After a certain time, the pulse signals φLAT0 and φLAT7 are set at a high level in order.

While the signal φLAT0 is at a high level, the NMOS transistor NT42 is switched to the conductive state. Since the NMOS transistor NT39 is in the conductive state at this time, in the case of 3, the second memory node N23*b* of the latch circuit Q23 is inverted to a low level and the first memory node N23*a* is inverted to a high level.

In the cases of 1 and 2, since originally the second memory node N23*b* of the latch circuit Q23 is at a low level and the first memory node N23*a* is at a high level, there is no effect.

While the signal φLAT7 is at a high level, the NMOS transistor NT60 is switched to a conductive state. Since the NMOS transistor NT41 is in the conductive state and the first memory node N23*a* of the latch circuit is inverted to a high level at this time, the NMOS transistor NT56 is held in the conductive state. Only in the case of the above 3 is the second memory node N22*b* of the latch circuit Q22 at a high level, so the NMOS transistor NT59 is held in the conductive state.

As a result, only in the case of the above 3 is the second memory node N21*b* of the latch circuit Q21 inverted to a low level and the first memory node N22*a* inverted to a high level. In the other cases of 1 and 2, the latch data remains unchanged.

On the other hand, when the threshold voltage Vth is less than the word line voltage VRD5 (Vth<VRD5), a cell current larger than the leak compensation current flows, and the bit line voltage falls, the NMOS transistor NT21 becomes the conductive state, a redistribution of the capacity CBL of the bit line (about 1V) and the capacity CSA (<<CBL) of the node SA21 (power source voltage Vcc) occurs, and the voltage of the node SA21 becomes 1V or about the same potential as that of the bit line voltage.

The gate voltage of the NMOS transistor NT39 is about 1V, the current value is small despite being turned "on", furthermore, the voltage VDS between the drain and the source of the NMOS transistor NT39 becomes larger when a current flows. As a result, the latch circuit Q23 cannot be inverted, the second memory node N23*b* is held at a high level, and the first memory node N23*a* is held at a low level.

Namely, the latch data is held unchanged at "000".

After this, the control is performed as explained below in the same way as above.

When the word line voltage is VRD4, only in the case of VRD5 >Vth>VRD4 is control performed so that the latch data of the latch circuits Q23, Q22, and Q21 is inverted to "100".

When the word line voltage is VRD3, only in the case of VRD4>Vth>VRD3 is control performed so that the latch data of the latch circuits Q23, Q22, and Q21 is inverted to "011".

When the word line voltage is VRD2, only in the case of VRD3>Vth>VRD2 is control performed so that the latch data of the latch circuits Q23, Q22, and Q21 is inverted to "010".

When the word line voltage is VRD1, only in the case of VRD2>Vth>VRD1 is control performed so that the latch data of the latch circuits Q23, Q22, and Q21 is inverted to "001".

The latch data latched by the latch circuits Q23, Q22, and Q21 in the above read operation is transferred to buses IO0, IO1, and IO2 via the NMOS transistors NT66 to NT68 serving as column gates and the read operation ends.

As explained above, according to the present embodiment, in a NAND flash memory for recording three-bit eight-level data in a memory transistor, since all of the bit lines are charged at the level of the power source voltage Vcc prior to the write operation, the bit lines are connected to a supply source of the voltage in accordance with the write data of the latch circuits Q23, Q22, and Q21, and the write operation is performed in parallel, the write time as a whole can be shortened and there is an advantage that the verify read and the normal read operations can be performed at a high speed.

While the invention has been described with reference to specific embodiments chosen for purpose of illustration, it should be apparent that numerous modifications could be made thereto by those skilled in the art without departing from the basic concept and scope of the invention.

What is claimed is:

1. A non-volatile semiconductor memory having a memory cell for storing data of a value in accordance with a threshold voltage which changes in accordance with a change of a charge stored in a charge storage portion in accordance with a voltage applied to a word line and a bit line and writing three-bit eight-level data to memory cells in page units, comprising:

a precharge apparatus for precharging all of said bit lines at a predetermined voltage prior to a write operation; and a write control circuit for performing said write operation in parallel, including a latch circuit for latching write data, wherein said bit line selected in accordance with an address is set at a voltage in accordance with said latched write data.

2. The non-volatile semiconductor memory as set forth in claim 1, wherein the write control circuit comprises three bits worth of said latch circuit corresponding to a pairs of bit lines.

3. The non-volatile semiconductor memory as set forth in claim 2, wherein:

said latch circuit comprises a first memory node for holding a level of said latch data and a second memory node for holding an inverted level to the level and an apparatus for connecting said selected bit line to a power supply source of a bit line set voltage when levels of the first memory node and the second memory node of said latch circuit are at predetermined levels.

4. The non-volatile semiconductor memory as set forth in claim 1, comprising a verify read circuit wherein a judgement whether or not respective writing bits are sufficiently written during said write operation is performed by lowering a word line voltage from a higher level to a lower level successively.

5. The non-volatile semiconductor memory as set forth in claim 3, comprising a verify read circuit wherein a judgement whether or not respective writing bits are sufficiently written during said write operation is performed by lowering a word line voltage from a higher level to a lower level successively.

6. A non-volatile semiconductor memory including, in a matrix array, memory strings each of which is comprised of a plurality of memory cells storing data of values in accordance with a threshold voltage which changes in accordance with a change of charges stored in charge storage portions in accordance with a voltage applied to a word line and a bit line and each of which has one end and another end connected to a bit line and a ground line via a selection transistor controlled in conductive state in accordance with a gate voltage, control gates of the memory cells of the same row being connected to a common word line, and writing three-bit eight-level data to memory cells in page units using self boosting, comprising:

a precharge apparatus for precharging all of said bit lines at a predetermined voltage prior to a write operation; and a write control circuit for performing said write operation in parallel, including a latch circuit for latching write data, wherein said bit line selected in accordance with an address is set at a bit line set voltage in accordance with said latched write data.

7. The non-volatile semiconductor memory as set forth in claim 6, wherein within said write control circuit, said latch circuit includes said latched write data having three-bits that correspond to a pair of bi t lines.

8. The non-volatile semiconductor memory as set forth in claim 7, wherein:

said latch circuit comprises a first memory node for holding a level of said latch data and a second memory node for holding an inverted level of said latch data; and an apparatus for connecting said selected bit line to a power supply source of said bit line set voltage when levels of the first memory node and the second memory node of said latch circuit are at a predetermined level.

9. The non-volatile semiconductor memory as set forth in claim 6, comprising a verify read circuit wherein a judgement whether or not respective writing bits are sufficiently written during said write operation is performed by lowering a word line voltage from a higher level to a lower level successively.

10. The non-volatile semiconductor memory as set forth in claim 8, comprising a verify read circuit wherein a judgement whether or not respective writing bits are sufficiently written during said write operation is performed by lowering a word line voltage from a higher level to a lower level successively.

11. A method of writing data in a non-volatile semiconductor memory having a memory cell for storing data of a value in accordance with a threshold voltage which changes in accordance with a change of a charge stored in a charge storage portion in accordance with a voltage applied to a word line and a bit line and writing three-bit eight-level data to memory cells in page units, comprising:

precharging all of said bit lines at a predetermined voltage prior to a write operation; and performing said write operation in parallel by setting a selected bit line in accordance with an address to a voltage in accordance with latch data when writing.

* * * * *

UNITED STATES PATENT AND TRADEMARK OFFICE

CERTIFICATE OF CORRECTION

PATENT NO. : 6,266,270 B1
DATED : July 24, 2001
INVENTOR(S) : Hiromi Nobukata

It is certified that error appears in the above-identified patent and that said Letters Patent is hereby corrected as shown below:

Column 21,
Line 19, replace "bi t" with -- bit --.

Signed and Sealed this

Twenty-seventh Day of May, 2003

JAMES E. ROGAN
*Director of the United States Patent and Trademark Office*